United States Patent
Sudo et al.

(10) Patent No.: US 9,115,019 B2
(45) Date of Patent: Aug. 25, 2015

(54) VITREOUS SILICA CRUCIBLE AND METHOD OF MANUFACTURING THE SAME

(75) Inventors: Toshiaki Sudo, Akita (JP); Hiroshi Kishi, Akita (JP); Eriko Suzuki, Akita (JP)

(73) Assignee: SUMCO CORPORATION, Tokyo (JP)

( * ) Notice: Subject to any disclaimer, the term of this patent is extended or adjusted under 35 U.S.C. 154(b) by 507 days.

(21) Appl. No.: 13/145,094

(22) PCT Filed: Dec. 14, 2010

(86) PCT No.: PCT/JP2010/072455
§ 371 (c)(1),
(2), (4) Date: Jun. 22, 2012

(87) PCT Pub. No.: WO2011/074568
PCT Pub. Date: Jun. 23, 2011

(65) Prior Publication Data
US 2012/0255487 A1   Oct. 11, 2012

(30) Foreign Application Priority Data

Dec. 14, 2009 (JP) .................... 2009-282748
Dec. 14, 2009 (JP) .................... 2009-282752
Dec. 14, 2009 (JP) .................... 2009-283302

(51) Int. Cl.
*C03B 19/06*  (2006.01)
*C03B 19/09*  (2006.01)
(Continued)

(52) U.S. Cl.
CPC ............... *C03B 19/095* (2013.01); *C03C 15/00* (2013.01); *C03C 17/23* (2013.01); *C03C 23/007* (2013.01); *C03C 23/0025* (2013.01); *C30B 15/10* (2013.01); *C30B 29/06* (2013.01); *C30B 35/002* (2013.01); *C03C 2218/345* (2013.01); *Y10T 117/1032* (2015.01)

(58) Field of Classification Search
CPC .... C30B 15/10; C30B 35/002; C30B 11/002; C03C 19/00; C03C 23/0025
USPC ....................... 117/200, 208, 213, 13; 65/17.3
See application file for complete search history.

(56) References Cited

U.S. PATENT DOCUMENTS 4,010,064 A * 3/1977 Patrick et al. ................. 117/208
5,174,801 A   12/1992 Matsumura
(Continued)

FOREIGN PATENT DOCUMENTS

CN   1341080 A    3/2002
EP   0463543 A1   1/1992
(Continued)

OTHER PUBLICATIONS

Patent Abstracts of Japan, Computer Translation of JP 2000-143386 (2014).*
(Continued)

*Primary Examiner* — Matthew Song
(74) *Attorney, Agent, or Firm* — Law Office of Katsuhiro Arai

(57) ABSTRACT

Provided is a method of manufacturing a vitreous silica crucible for pulling a silicon single crystal which can suppress melt surface vibration of silicon melt filled therein and has a long lifetime. The crucible includes a peripheral wall portion, a curved portion and a bottom portion, and has a plurality of micro recesses on the specific region of the inner surface of the peripheral wall portion.

2 Claims, 5 Drawing Sheets

(51) Int. Cl.
*C03C 15/00* (2006.01)
*C03C 23/00* (2006.01)
*C30B 15/10* (2006.01)
*C30B 29/06* (2006.01)
*C30B 35/00* (2006.01)
*C03C 17/23* (2006.01)

(56) References Cited

U.S. PATENT DOCUMENTS

| | | | |
|---|---|---|---|
| 6,548,131 B1 * | 4/2003 | Englisch et al. | 428/34.4 |
| 2003/0041623 A1 | 3/2003 | Werdecker et al. | |
| 2004/0118156 A1 * | 6/2004 | Korus et al. | 65/17.3 |
| 2004/0187771 A1 * | 9/2004 | Tsuji et al. | 117/220 |
| 2007/0256628 A1 * | 11/2007 | Saito et al. | 117/213 |
| 2011/0011334 A1 | 1/2011 | Shimazu et al. | |

FOREIGN PATENT DOCUMENTS

| | | | | |
|---|---|---|---|---|
| JP | 02-188488 A | | 7/1990 | |
| JP | 06-329493 A | | 11/1994 | |
| JP | 08-002932 A | | 1/1996 | |
| JP | 2000143386 A | * | 5/2000 | ............ C30B 15/10 |
| JP | 2000-327478 A | | 11/2000 | |
| JP | 2004-250304 A | | 9/2004 | |
| JP | 2005-272178 A | | 10/2005 | |
| JP | 2005272178 A | * | 10/2005 | ............ C30B 15/10 |
| JP | 2006-265017 A | | 10/2006 | |
| TW | 200944625 A | | 11/2009 | |

OTHER PUBLICATIONS

Taiwan Office Action issued by Taiwan Patent Office, mailed on May 31, 2013 for Taiwan counterpart application No. 099143777.
International Search Report for PCT/JP2010/072455; mail date Jan. 25, 2011.
Extended European Search Report mailed May 23, 2012, issued in corresponding Application No. EP 10837594.0.
A Notification of First Office Action with Search Report issued by the State Intellectual Property Office of China, mailed Aug. 22, 2014, for Chinese counterpart application No. 201080008271.1.

* cited by examiner

VITREOUS SILICA CRUCIBLE AND METHOD OF MANUFACTURING THE SAME

TECHNICAL FIELD

The present invention relates to a vitreous silica crucible and a method of manufacturing the same.

BACKGROUND ART

In general, the Czochralski method (CZ method) has been widely used as a method of manufacturing a silicon single crystal for manufacturing a semiconductor. In the CZ method, as shown in FIGS. 1 and 2, a seed crystal 102, which is a single crystal, is dipped into silicon melt 101 of polycrystalline silicon in a crucible 100 made of vitreous silica. At this time, the seed crystal is subjected to a drastic heat shock, and dislocation occurs at the tip of the seed crystal. The dislocation is removed by forming a neck 103 so that the subsequently grown silicon is not affected adversely by the dislocation. Then, the seed crystal is gradually pulled up while being rotated and the pulling speed and the melt temperature are controlled, to increase the diameter of the seed crystal to form a shoulder 104. After a desired diameter is achieved, the pulling is continued under the control that the constant diameter is maintained, to form a straight body 105. Finally, a tail 106 is formed by gradually reducing the diameter, to manufacture an ingot 107 of a silicon single crystal.

In general, as shown in FIG. 1, the vitreous silica crucible used for pulling of a silicon single crystal uses natural fused silica 108 on the outer portion to increase the mechanical strength of the crucible, and uses synthetic fused silica 109 on the inner portion to avoid mixing of the impurities.

Here, "natural fused silica" is vitreous silica made of natural silica powder, and "synthetic fused silica" is vitreous silica made of synthetic silica powder. In general, the reaction $SiO_2$ (solid)→Si (liquid)+2O occurs on the interface between the synthetic fused silica 109 and the silicon melt 101 to dissolve the synthetic fused silica 109.

When pulling a silicon single crystal, the reaction Si (liquid)+O→SiO (gas) occurs to produce SiO gas depending on the increase of the pulling temperature and decrease of the ambient pressure. In this case, as shown in FIGS. 3(a) and 3(b), the silicon melt 101 may be repelled from the surface of the synthetic fused silica 109 to generate melt surface vibration. In FIGS. 3(a) and 3(b), the melt surface vibration is exaggerated to clearly explain the state of the melt surface vibration.

When such melt surface vibration is generated, the seed crystal 102 cannot be contacted with a flat melt surface, and silicon can be polycrystallized during pulling, which is problematic. In particular, the dipping of the seed crystal and the shoulder formation, which are initial processes in pulling of a silicon single crystal, are likely to be affected adversely by melt surface vibration. The influence largely determines the quality of the pulled silicon single crystal ingot. Therefore, a technique to suppress the melt surface vibration of silicon melt in these processes has been demanded.

Patent Document 1 discloses a technique to suppress melt surface vibration of silicon melt filled in a vitreous silica crucible by adjusting the bubble content, to a certain range, of the inner surface layer of the crucible in a region near the melt surface at the beginning of pulling. This technique is based on the finding that the melt surface vibration of the silicon melt at the beginning of pulling is influenced by the bubble content of the inner surface layer of the crucible in a region near the melt surface.

For example, when a large amount of bubbles is contained in the vitreous silica crucible, the vitreous silica is dissolved as the reaction $SiO_2$ (solid)→Si (liquid)+2O proceeds, and thus open bubbles come out as shown in FIG. 4. These open bubbles 201 suppress the melt surface vibration in the same principle as that of boiling stone which suppresses bumping.

PRIOR ART REFERENCE

Patent Document

Patent Document 1: JP-A-2004-250304

SUMMARY OF THE INVENTION

Problems to be Solved by the Inventions

However, in the technique described in Patent Document 1, a large amount of bubbles 202 is contained in the vitreous silica, and thus the ratio of the crucible itself to the volume of the vitreous silica crucible 1 is substantially reduced, and thus this causes a problem in that the melting speed of the vitreous silica crucible is increased compared with the case where the bubbles are not contained. This leads to the shortening of the lifetime of the vitreous silica crucible. Recently, a crucible with a large opening diameter has been demanded to pull a silicon single crystal with a large diameter. This increases the cost for the vitreous silica crucible, and thus a vitreous silica crucible whose melting speed is slow and thus lifetime is long in addition to the function of suppressing the melt surface vibration has been demanded. Furthermore, the closed bubbles directly below the inner surface of the crucible peripheral wall portion can cause a problem in that they can expand and rupture during pulling, which causes silica pieces to be mixed in the silicon melt. Therefore, the improvement of the yield of a silicon single crystal has been demanded.

The purpose of the present invention is to provide a vitreous silica crucible for pulling a silicon single crystal which can stably suppress melt surface vibration of silicon melt filled therein and has a long lifetime, and a method of manufacturing the same.

Means for Solving the Problems

To achieve the above-mentioned object, the summarized configurations of the present invention are as follows.
(1) A vitreous silica crucible for pulling a silicon single crystal, including a peripheral wall portion, a curved portion and a bottom portion, wherein a plurality of micro recesses are provided on a specific region of an inner surface of the peripheral wall portion.
(2) The vitreous silica crucible of the above (1), wherein the specific region is located in a region of 0.5H to 0.99 H from the bottom portion, where H is a height of the vitreous silica crucible.
(3) The vitreous silica crucible of the above (1), wherein the specific region is divided into ring-shaped inner portions each having a width of 0.1 mm to 5.0 mm and the specific region has at least one micro recess in each of the ring-shaped inner portions.
(4) The vitreous silica crucible of the above (1), wherein the average diameter of the micro recesses is in the range of 1 μm to 500 μm.
(5) The vitreous silica crucible of the above (1), wherein the average depth of the micro recesses is in the range of 0.05% to 50% of the thickness of the crucible in the peripheral wall portion.

(6) The vitreous silica crucible of the above (1), wherein the ratio of the average diameter to the average depth, of the micro recesses, is less than 0.8.

(7) A method of manufacturing a vitreous silica crucible for pulling a silicon single crystal, the crucible including a peripheral wall portion, a curved portion and a bottom portion and having an outer layer of a natural fused silica layer and an inner layer of a synthetic fused silica layer, the method including the processes of:

forming an outer layer of natural silica powder;

forming an inner layer of synthetic silica powder on an inner surface of the outer layer;

forming a vitreous silica crucible having a peripheral wall portion, a curved portion and a bottom portion by fusing the layers from an inner surface side of the inner layer by arc discharge; and;

forming a plurality of micro recesses in a specific region after the process of forming the vitreous silica crucible.

(8) The method of the above (7), wherein the process of forming the micro recesses includes a process of forming the micro recesses by use of physical grinding using such as a carbon dioxide laser or diamond tool.

Effect of the Invention

According to the present invention, it is possible to provide a method of manufacturing a vitreous silica crucible for pulling a silicon single crystal which can suppress melt surface vibration of silicon melt filled therein and has a long lifetime, by providing a plurality of micro recesses in a specific region of the inner surface of the peripheral wall portion.

DESCRIPTION OF THE PREFERRED EMBODIMENTS

Hereinafter, embodiments of the present invention are explained with reference to drawings. In all drawings, corresponding components are given an identical symbol, and the explanation is omitted.

<Vitreous Silica Crucible>

Figure 1:
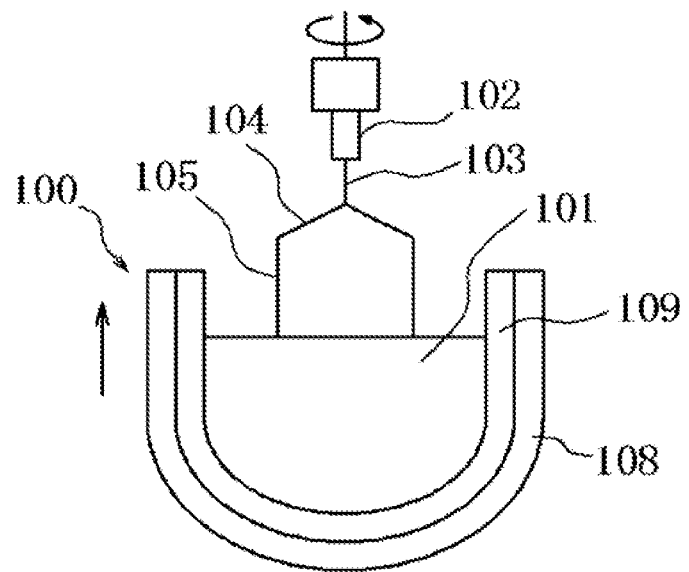
FIG. 1 is a schematic sectional view for explaining a method of manufacturing a silicon single crystal.
Figure 2:
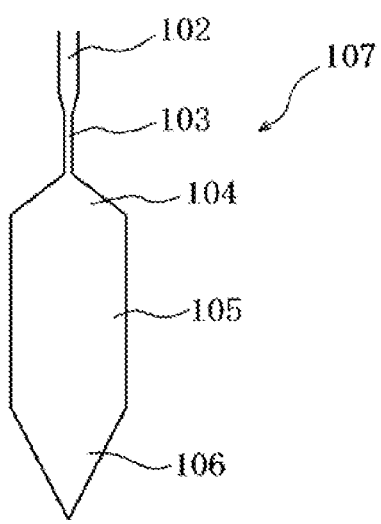
FIG. 2 is a plan view of a common silicon ingot manufactured by a pulling method.
Figure 3A:
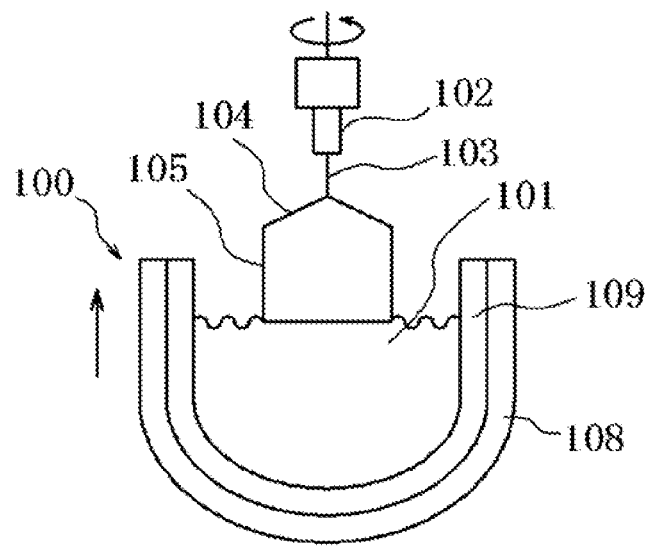
FIG. 3($a$) is a schematic sectional view for explaining melt surface vibration of silicon melt, and FIG. 3($b$) is a schematic plan view showing melt surface vibration of silicon melt.
Figure 3B:
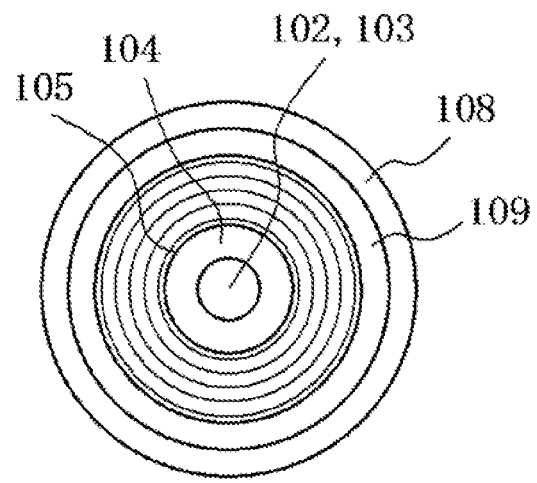
Figure 4:
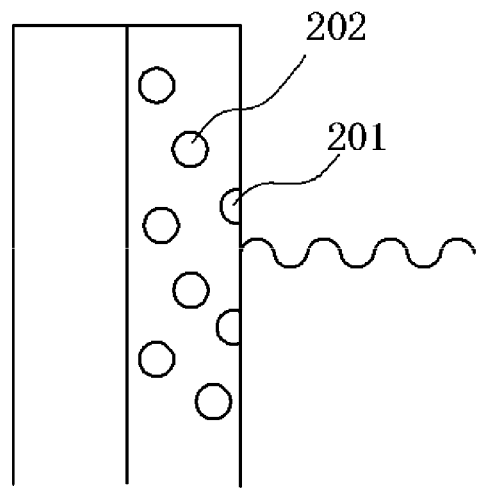
FIG. 4 is a schematic sectional view of a crucible peripheral wall portion showing bubbles contained in a conventional vitreous silica crucible.
Figure 5:
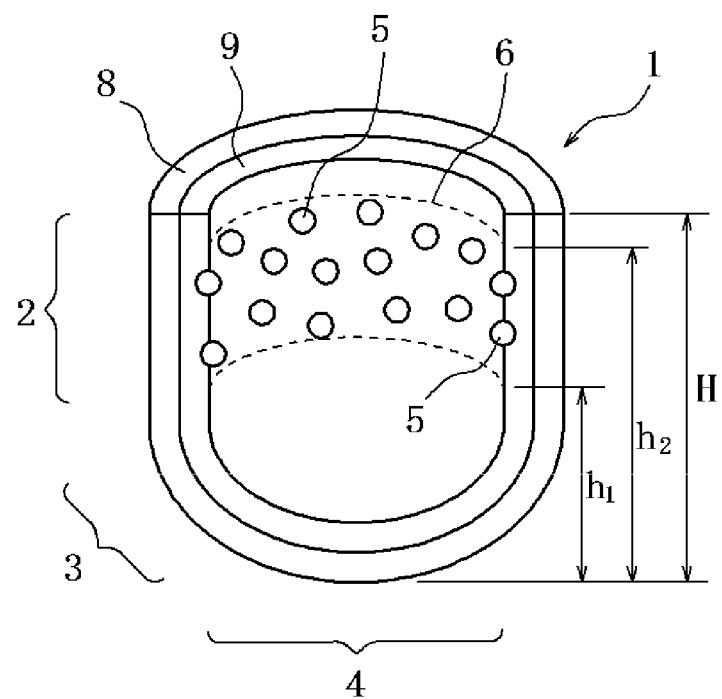
FIG. 5 is a cross-sectional perspective view showing a vitreous silica crucible for pulling a silicon single crystal, according to the present invention.

First, a vitreous silica crucible for pulling a silicon single crystal, according to the present embodiment, is explained with reference to drawings. The vitreous silica crucible for pulling a silicon single crystal, according to the present embodiment, for example, as shown in FIG. 5, includes a peripheral wall portion 2, a curved portion 3 and a bottom portion 4, and has two layers which are an outer layer of a natural fused silica layer 8 and an inner layer of a synthetic fused silica layer 9.

This vitreous silica crucible for pulling a silicon single crystal 1 includes a plurality of micro recesses 5 in a specific region 6 of the inner surface of the peripheral wall portion 2, and thus suppresses melt surface vibration of silicon melt filled therein. Furthermore, the vitreous silica crucible for pulling a silicon single crystal 1 does not intend to contain a large amount of bubbles in the synthetic fused silica layer 9, and thus the melting speed does not increase, and thus the lifetime thereof is elongated.

Figure 6:
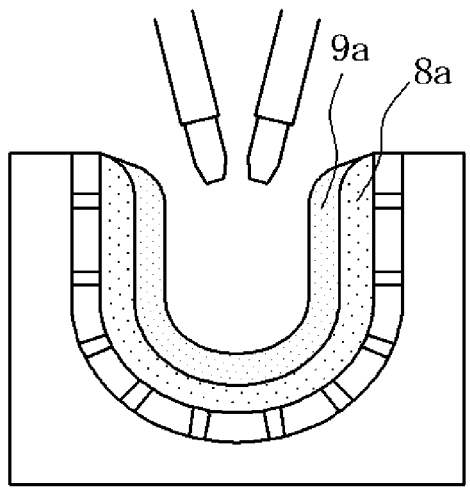
FIG. 6 is a schematic sectional view showing a method of manufacturing a vitreous silica crucible.

In general, the vitreous silica crucible for pulling a silicon single crystal 1 can be manufactured, for example, as shown in FIG. 6, by molding silica powder into a crucible shape by use of centrifugal force so as to have natural silica powder 8$a$ in the outer portion and synthetic silica powder 9$a$ in the inner portion. Then, arc discharge is performed in the crucible-shaped powder to fuse the natural silica powder 8$a$ and the synthetic silica powder 9$a$, followed by cooling. Thus, the crucible 1 having two-layer structure of natural fused silica 8 and synthetic fused silica 9 is formed.

Here, the synthetic silica powder 9$a$ refers to powder made of synthetic silica. Synthetic silica is a chemically synthesized or manufactured material, and the synthetic fused silica powder is amorphous. Raw material of synthetic silica is gas or liquid, and thus can be easily purified. Thus, synthetic silica powder can be made purer than natural silica powder. Raw material for synthetic fused silica may be a gas such as silicon tetrachloride or a liquid such as silicon alkoxide. In the present embodiment, impurities in the synthetic silica powder fused silica may be each 0.1 ppm or less.

On the other hand, the natural silica powder 8$a$ refers to powder made of natural silica. Natural silica is a material obtained by digging out naturally existing quartz raw stone, followed by crushing and purifying etc. Natural silica powder is made of α-quartz crystal. Natural silica powder contains Al and Ti in an amount of 1 ppm or more, and contains other metal impurities in an amount larger than synthetic silica powder. Natural silica powder hardly contains silanol. Fused silica obtained by fusing natural silica powder contains silanol in an amount of less than 50 ppm.

These natural fused silica 8 and synthetic fused silica 9 can be distinguished, for example, by observing a fluorescence peak in a fluorescence spectrum obtained by exciting the fused silica with ultraviolet rays of a wavelength of 245 nm.

In the present embodiment, silica powder is used as a material for natural fused silica 8 and synthetic fused silica 9. "Silica powder" used herein is not limited to quartz, but may include powder of a material well-known as raw material for the vitreous silica crucible, such as quartz crystal, quartz sand, etc.

The amount of silicon melt in the vitreous silica crucible 1 varies as pulling of a silicon single crystal proceeds. Therefore, the specific region 6 may be appropriately selected in accordance with the amount of silicon melt in the vitreous silica crucible 1 when the crucible 1 is used by a user. It can be a region at which a melt surface is located at least when a shoulder is formed (In FIG. 5, a region from an h1 height position to an h2 height position). In particular, this region may be preferably a region from 0.5 H to 0.99 H, and more preferably a region from 0.60H to 0.90H when measured from the bottom, where H is a crucible height.

Figure 7:
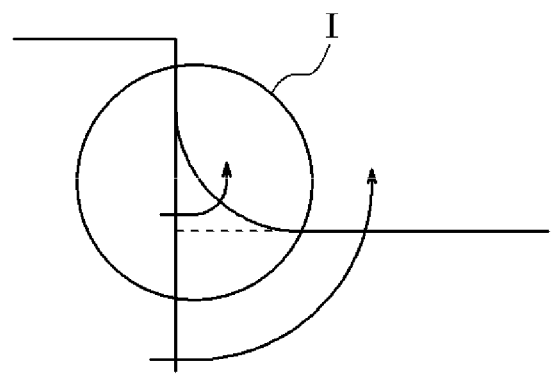
FIG. 7 is a schematic sectional view enlarging a portion of the interface between the vitreous silica crucible and silicon melt.

Thus, the reason why melt surface vibration is likely to occur in a region where the melt surface is located is explained below. FIG. 7 is a schematic sectional view enlarging a part of a melt surface position of silicon melt in the vitreous silica crucible 1. Thus, liquid silicon melt has a cross-sectional shape, due to wettability of vitreous silica crucible 1, shown in the region I in FIG. 7 in an interface with the solid vitreous silica crucible.

Figure 8:
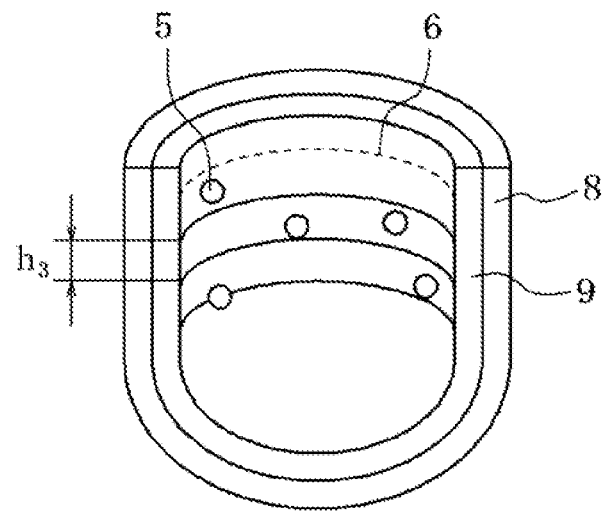
FIG. 8 is a cross-sectional perspective view showing a formed pattern of micro recesses.

The distance from the melt surface to the crucible is closer in the region I than other regions. Because the oxygen concentration in the melt surface is low, the concentration gradient of oxygen is larger in the region I, and thus diffusion of O produced by a reaction of $SiO_2$(solid)→Si (liquid)+2O is faster. Thus, the reaction readily proceeds, and thus dissolution of the crucible is promoted. In general, the region I is 0.1 mm to 5.0 mm in the height direction of the crucible, and thus it is preferable that the specific region 6 is divided into ring-shaped inner portions each having a width of 0.1 mm to 5.0 mm (preferably 0.2 mm to 4.0 mm) (width of h3 in FIG. 8) and the specific region 6 has at least one micro recess 5 in each of the ring-shaped inner portions.

The average diameter of the micro recesses 5 is preferably in the range of 1 μm to 500 μm, and particularly preferably in the range of 10 μm to 300 μm. When the average diameter of the micro recesses 5 is less than 1 μm, the micro recesses 5 is not as effective as the boiling stone. When the average diameter of the micro recesses 5 is over 500 μm, the micro recesses 5 is not as effective as the boiling stone, and can easily disappear by dissolution of the crucible.

The average depth of the micro recesses 5 is preferably in the range of 0.05% to 50%, and more preferably in the range of 0.10% to 30%, of the crucible thickness in the peripheral wall portion 2. When the average depth of the micro recesses 5 is less than 0.05% of the crucible thickness in the peripheral wall portion 2, the micro recesses 5 can disappear by dissolution of the vitreous silica crucible. When the average depth of the micro recesses 5 is over 50% of the crucible thickness in the peripheral wall portion 2, the wall strength of the crucible can be affected adversely. The thickness of the peripheral wall portion 2 is, for example, preferably 100 μm to 1000 μm.

Furthermore, the vitreous silica crucible 1 of the present embodiment does not contain bubbles below the micro recesses 5 (radially outward of the micro recesses 5) formed in the specific region 6 of the peripheral wall portion 2. When a large amount of bubbles are contained in vitreous silica, the ratio of the crucible itself to the volume of the vitreous silica crucible 1 is reduced, and thus the melting speed of the vitreous silica crucible 1 is increased, which is problematic. Furthermore, the large amount of bubbles can decrease the strength of the vitreous silica crucible.

Furthermore, the ratio of the average diameter to the average depth, of the micro recesses 5, is preferably over 0 and less than 0.8, and particularly preferably over 0.1 and less than 0.7. For the purpose of inhibiting the recesses from disappearing due to dissolution of the vitreous silica crucible, it is necessary to inhibit the reaction "$SiO_2$(solid)→Si (liquid)+2O." This reaction can be suppressed by increasing oxygen concentration in the silicon melt on the interface between the vitreous silica crucible and the melt. The oxygen concentration can be increased by inhibiting diffusion of oxygen generated by the above reaction. Thus, to suppress influence of heat convection of silicon melt, it is preferable that the diameter and the depth are stipulated so that the ratio is within the above-mentioned range.

<Method of Manufacturing Vitreous Silica Crucible>

The crucible manufactured by a method of manufacturing a vitreous silica crucible for pulling a silicon single crystal 1, according to the present embodiment, for example, as shown in FIGS. 5 and 6, includes a peripheral wall portion 2, a curved portion 3 and a bottom portion 4, and includes two layers of an outer layer of a natural fused silica layer 8 and an inner layer of a synthetic fused silica layer 9. The method includes processes of forming an outer layer of natural silica powder 8a; forming an inner layer of synthetic silica powder 9a on the inner surface of the outer layer; form the vitreous silica crucible having the peripheral wall portion 2, the curved portion 3 and the bottom portion 4 by fusing the layers from the inner surface side of the inner layer by arc discharge; and forming a plurality of micro recesses 5 in a specific region 6. Due to this method, provided is a vitreous silica crucible for pulling a silicon single crystal 1, which can suppress melt surface vibration of silicon melt filled therein, and has a long life span.

It is preferred that the micro recesses 5 are formed by use of a carbon dioxide laser or diamond tool. For example, the micro recesses 5 can be formed by irradiating the inner surface of the crucible with infrared light having a wavelength of 10.6 μm while the emitting surface of the carbon dioxide laser is faced to the inner surface of the crucible. Alternatively, as to the diamond tool, the micro recesses 5 can be formed by applying, to the inner surface of the crucible, a drill for brittle material coated with diamond, produced by Mitsubishi Materials Corp., for example, while supplying water to the drill. Grinding and rotation or lift up-down of the crucible are repeated to form the micro recesses on the entire inner surface in the specific region 6.

<Modified Example 1 of Method of Manufacturing Vitreous Silica Crucible>

As described above, the present inventors have found a technique to suppress melt surface vibration of silicon melt by providing pits (micro recesses 5) on the inner surface of the vitreous silica crucible 1. However, when the pits are formed on the crucible inner surface by use of, for example, a laser or machining, processing strain may be introduced in the vitreous silica crucible 1. When the processing strain is in the vitreous silica crucible 1, the melting speed of the crucible increases during pulling of a silicon single crystal, and the lifetime of the vitreous silica crucible is shortened. This is a problem the inventors have newly recognized.

Then, the present inventors have made extensive research on this problem, and have found that it is possible to provide a method of manufacturing a vitreous silica crucible for pulling a silicon single crystal 1 which can suppress melt surface vibration of silicon melt filled therein and has a long lifetime, by removing or releasing the processing strain introduced in the vitreous silica crucible in the process of forming the micro recesses 5.

The method of manufacturing a vitreous silica crucible for pulling a silicon single crystal 1, according to the present embodiment, may further includes a process of removing or releasing the processing strain introduced in the process of forming the micro recesses 5.

Here, the process of removing or releasing the processing strain may include a process of heat-treating the vitreous silica crucible. This process of heat-treating the vitreous silica crucible 1 includes a process of heating the vitreous silica crucible at a temperature of preferably in the range of 1200 deg. C. to 1400 deg. C., and more preferably in the range of 1250 deg. C. to 1350 deg. C. When the temperature is less than 1200 deg. C., the processing strain is unlikely to be removed or released. When the temperature is over 1400 deg. C., the vitreous silica crucible may be melted. It is not always necessary to heat-treat the entire vitreous silica crucible, but only the specific region may be subjected to the heat treatment to sufficiently remove or release the processing strain.

Furthermore, the period of the heat treatment may be preferably 5 min. or more, and particularly preferably 10 min. or more to sufficiently remove or release the processing strain. Furthermore, the period of the heat treatment may be preferably 1 hour or less, and particularly preferably 30 min. or less so as not to reduce productivity.

Furthermore, the process of removing or releasing the processing strain may include a process of acid-treating the vitreous silica crucible 1. The acid treatment process may include a process of immersing, multiple times, the vitreous silica crucible 1 into an aqueous solution of hydrofluoric acid in a predetermined concentration. The hydrogen fluoride concentration of the aqueous solution of hydrofluoric acid is preferably in the range of 20% to 30%, and particularly preferably in the range of 23% to 27% so as to be effective for sufficiently removing or releasing the processing strain and so as not to dissolve the vitreous silica crucible itself. It is not always necessary to acid-treat the entire vitreous silica crucible, but only the specific region may be subjected to the acid treatment to sufficiently remove or release the processing strain.

The number of immersing is preferably 1 or more, more preferably 2 or more, and particularly preferably 3 so as to be effective for sufficiently removing or releasing the processing strain and so as not to dissolve the vitreous silica crucible itself. The number of immersing is preferably 10 or less, and more preferably 5 or less. The etching thickness of the inner surface of the vitreous silica crucible 1 is preferably about 10 µm to 15 µm and more preferably about 11 µm to 14 µm.

Thus, in the present embodiment, the processing strain introduced in the vitreous silica crucible 1 in the process of forming the micro recesses 5 is removed or released in the process of heat-treating or acid-treating the vitreous silica crucible 1 as mentioned above. Therefore, it is possible to provide a method of manufacturing a vitreous silica crucible for pulling a silicon single crystal 1 which can suppress melt surface vibration of silicon melt filled therein and has a long lifetime.

<Modified Example 2 of Method of Manufacturing Vitreous Silica Crucible>

By the way, a pattern with brown rings may be formed on the interface between high-temperature silicon melt and the vitreous silica crucible 1. This is called a "Brown Ring," and made of cristobalite which is a stable crystal of $SiO_2$ in the temperature and pressure region during pulling of a silicon single crystal. When the Brown Ring grows, it starts to peel off from the central portion of the ring, and the peeled-off crystal pieces deteriorate the single crystallization rate of a silicon single crystal, and the yield is lowered. Conventionally, a technique to coat the crucible inner surface with barium to crystallize the cristobalite layer is known as a technique to suppress peeling of the cristobalite layer.

However, when barium powder is merely sprinkled on the inner surface of the vitreous silica crucible 1, the barium powder drops, and thus a sufficient amount of barium powder coating is achieved, and thus the cristobalite layer cannot be sufficiently crystallized, which has been problematic.

Here, the present inventors have made extensive research on this problem, and have found that it is possible to crystallize the specific region 6 by applying a crystallization promoter on the specific region to achieve a sufficient amount of barium powder coating. The crystallization of the specific region 6 suppresses peeling of cristobalite, and thus enables pulling of a silicon single crystal with a high yield.

That is, a method of manufacturing a vitreous silica crucible, according to the present embodiment, further includes a process of introducing a crystallization promoter into the specific region 6. It is preferred that the process of introducing the crystallization promoter includes a process of applying a crystallization promoter on the specific region 6. In this introduction process, it is possible to uniformly apply the crystallization promoter to the entire specific region with micro recesses 5, by sprinkling the crystallization promoter to the vitreous silica crucible 1 while rotating the vitreous silica crucible 1. The crystallization promoter may be injected to the micro recesses provided on the specific region by use of a nozzle etc. In this case, the crystallization promoter stays in the recesses in a large amount, and thus it is advantageous in that the crystallization promoter is less likely to drop. The crystallization promoter may be introduced by use of powder application, a ink jet method, a sol-gel inclusion method etc.

It is preferred that the crystallization promoter may be Ba powder in view of the segregation coefficient. Because the segregation coefficient of Ba is small, the amount of barium mixed in a silicon single crystal is extremely small, and thus a problem of mixing of barium to silicon melt is unlikely to occur.

Compared with the case where only the micro recesses 5 are provided on the specific region, the surface crystallization reduces the melting speed of the vitreous silica crucible 1, and further suppresses melt surface vibration. In addition, it increases the strength of the vitreous silica crucible 1, and thus increases the yield of single crystal silicon.

The embodiments of the present invention have been described with reference to drawings. These are examples of the present invention, and the present invention may employ various other configurations.

INDUSTRIAL APPLICABILITY

According to the present invention, it is possible to provide a method of manufacturing a vitreous silica crucible for pulling a silicon single crystal 1 which can suppress melt surface vibration of silicon melt filled therein and has a long lifetime, by providing a plurality of micro recesses in a specific region of the inner surface of the peripheral wall portion.

EXPLANATION OF REFERENCE SYMBOL 1 vitreous silica crucible
2 peripheral wall portion
3 curved portion
4 bottom portion
5 micro recesses
6 a specific region
8 natural fused silica
8a natural silica powder
9 synthetic fused silica
9a synthetic silica powder
H crucible height
100 vitreous silica crucible
101 melt polycrystalline silicon
102 seed crystal
103 neck
104 shoulder
105 straight body portion
106 tail
107 silicon ingot
108 natural fused silica
109 synthetic fused silica
201 open bubble
202 independent bubble

The invention claimed is:

1. A method of manufacturing a vitreous silica crucible for pulling a silicon single crystal, the crucible comprising a peripheral wall portion, a curved portion and a bottom portion and having an outer layer of a natural fused silica layer and an inner layer of a synthetic fused silica layer, the method comprising the processes of:

forming an outer layer of natural silica powder;

forming an inner layer of synthetic silica powder on an inner surface of the outer layer;

forming a vitreous silica crucible having a peripheral wall portion, a curved portion and a bottom portion by fusing the layers from an inner surface side of the inner layer by arc discharge;

forming a plurality of micro recesses in a specific region by use of physical processing using a carbon dioxide laser or diamond tool after the process of forming the vitreous silica crucible; and removing processing strain introduced in the process of forming the micro recesses by heat-treating the vitreous silica crucible at a temperature of 1200 to 1400 deg. C. for 5 minutes to one hour;

wherein the thickness of the peripheral wall portion is in the range of 100 μm to 1000 μm;

the specific region is located in a region of 0.60 H to 0.90 H from the bottom portion, where H is a height of the vitreous silica crucible;

the specific region is divided into ring-shaped inner portions each having a width of 0.2 mm to 4.0 mm and the specific region has at least one micro recess in each of the ring-shaped inner portions;

the average diameter of the micro recesses is in the range of 10 μm to 300 μm;

the average depth of the micro recesses is in the range of 0.10% to 30% of the thickness of the crucible in the peripheral wall portion; and the ratio of the average diameter to the average depth, of the micro recesses, is less than 0.7.

2. A method of manufacturing a vitreous silica crucible for pulling a silicon single crystal, the crucible comprising a peripheral wall portion, a curved portion and a bottom portion and having an outer layer of a natural fused silica layer and an inner layer of a synthetic fused silica layer, the method comprising the processes of:

forming an outer layer of natural silica powder;

forming an inner layer of synthetic silica powder on an inner surface of the outer layer;

forming a vitreous silica crucible having a peripheral wall portion, a curved portion and a bottom portion by fusing the layers from an inner surface side of the inner layer by arc discharge;

forming a plurality of micro recesses in a specific region by use of physical processing using a carbon dioxide laser or diamond tool after the process of forming the vitreous silica crucible; and removing processing strain introduced in the process of forming the micro recesses by acid-treating the vitreous silica crucible one to ten times with an aqueous solution of hydrofluoric acid having a hydrogen fluoride concentration of 20% to 30%;

wherein the thickness of the peripheral wall portion is in the range of 100 μm to 1000 μm;

the specific region is located in a region of 0.60 H to 0.90 H from the bottom portion, where H is a height of the vitreous silica crucible;

the specific region is divided into ring-shaped inner portions each having a width of 0.2 mm to 4.0 mm and the specific region has at least one micro recess in each of the ring-shaped inner portions;

the average diameter of the micro recesses is in the range of 10 μm to 300 μm;

the average depth of the micro recesses is in the range of 0.10% to 30% of the thickness of the crucible in the peripheral wall portion; and the ratio of the average diameter to the average depth, of the micro recesses, is less than 0.7.

* * * * *